United States Patent [19]

Reuss

[11] Patent Number: 4,718,165
[45] Date of Patent: Jan. 12, 1988

[54] ASSEMBLING ELECTRICAL CONNECTORS TO A CIRCUIT BOARD

[75] Inventor: George D. Reuss, Harrisburg, Pa.
[73] Assignee: AMP Incorporated, Harrisburg, Pa.
[21] Appl. No.: 910,911
[22] Filed: Sep. 24, 1986
[51] Int. Cl.$^4$ .................. H01R 9/00; B23P 19/00
[52] U.S. Cl. .................................. 29/842; 29/741
[58] Field of Search ............. 140/140; 29/741, 842, 29/739, 837, 838

[56] References Cited

U.S. PATENT DOCUMENTS

| | | | |
|---|---|---|---|
| 4,461,073 | 7/1984 | Harringer et al. | 29/741 |
| 4,472,668 | 9/1984 | Mutsehler et al. | 29/741 X |
| 4,510,683 | 4/1985 | Fedde et al. | 29/741 X |
| 4,543,713 | 10/1985 | Rapp | 29/741 X |
| 4,616,414 | 10/1986 | Cushman | 29/741 X |
| 4,628,594 | 12/1986 | Yamagami et al. | 29/741 |

Primary Examiner—Howard N. Goldberg
Assistant Examiner—Carl J. Arbes
Attorney, Agent, or Firm—Thomas G. Terrell

[57] ABSTRACT

A pick-up head for picking up elongate electrical connectors having contact tails depending therefrom and for placing the connectors on circuit boards to insert the contact tails through holes therein, comprises a framework having a vertical shaft for attachment to the Z-axis shaft of a pick-and-place robot. Connector clamping bars on the framework are movable vertically with respect thereto by means of a first drive unit and are also movable towards and away from each other by means of second drive units. A contact tail comb assembly on the framework is movable towards and away from the clamping bars by means of third drive units. The clamping bars are adapted not only to grip a connector to be picked up, but to straighten it out to correct warpage, and the comb assembly is adapted to straighten out the contact tails of a connector which has been gripped by the bars and lifted from a connector pick-up station.

7 Claims, 10 Drawing Figures

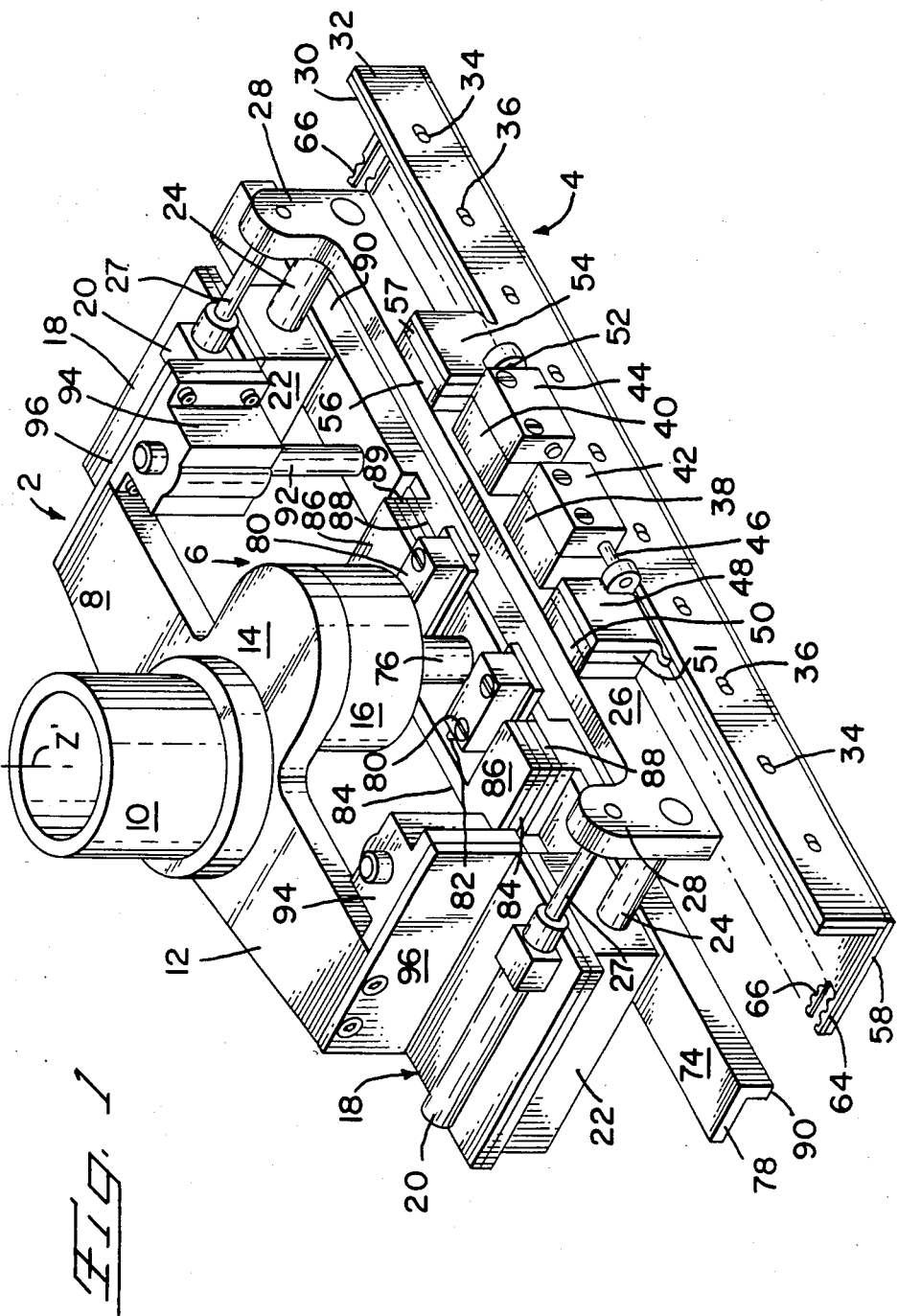

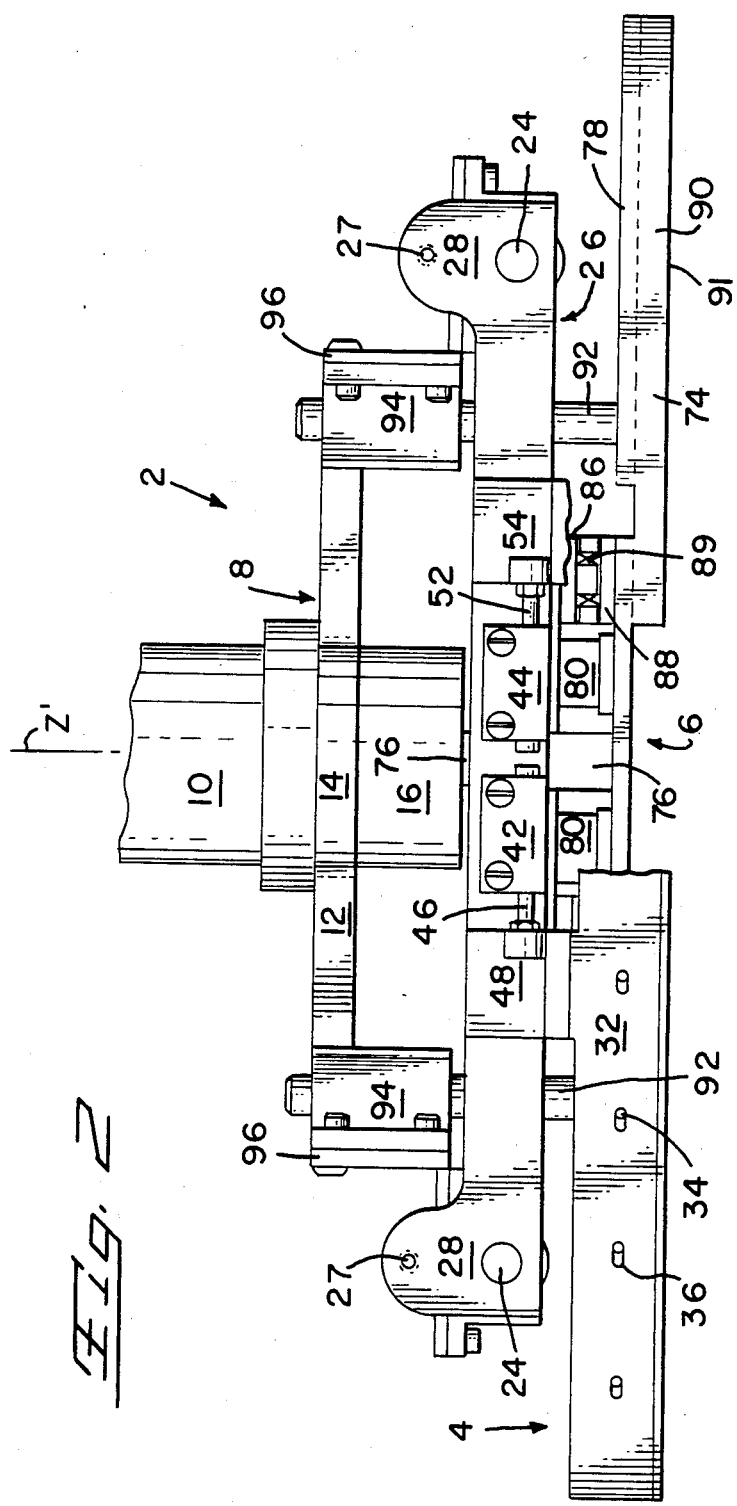

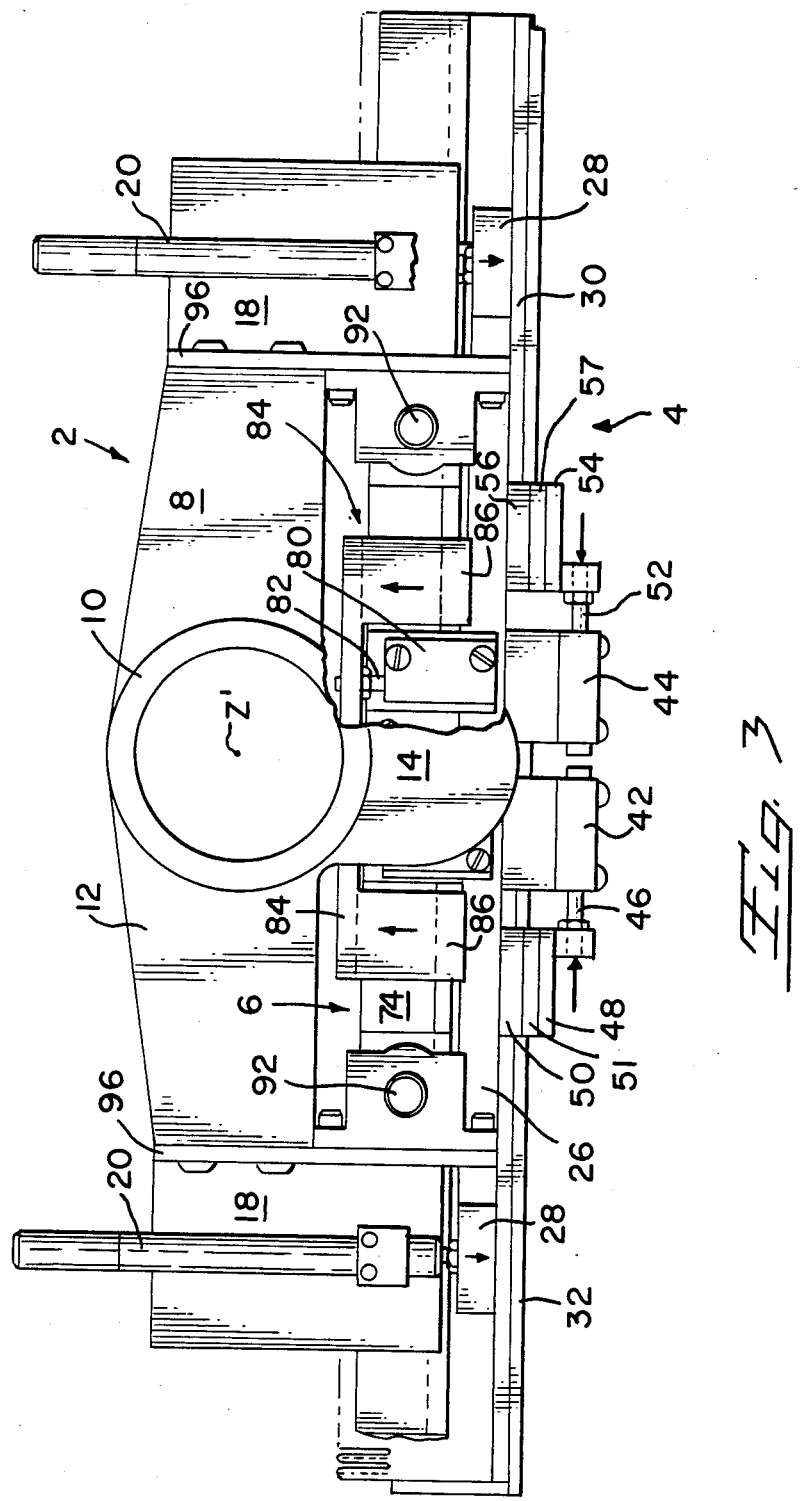

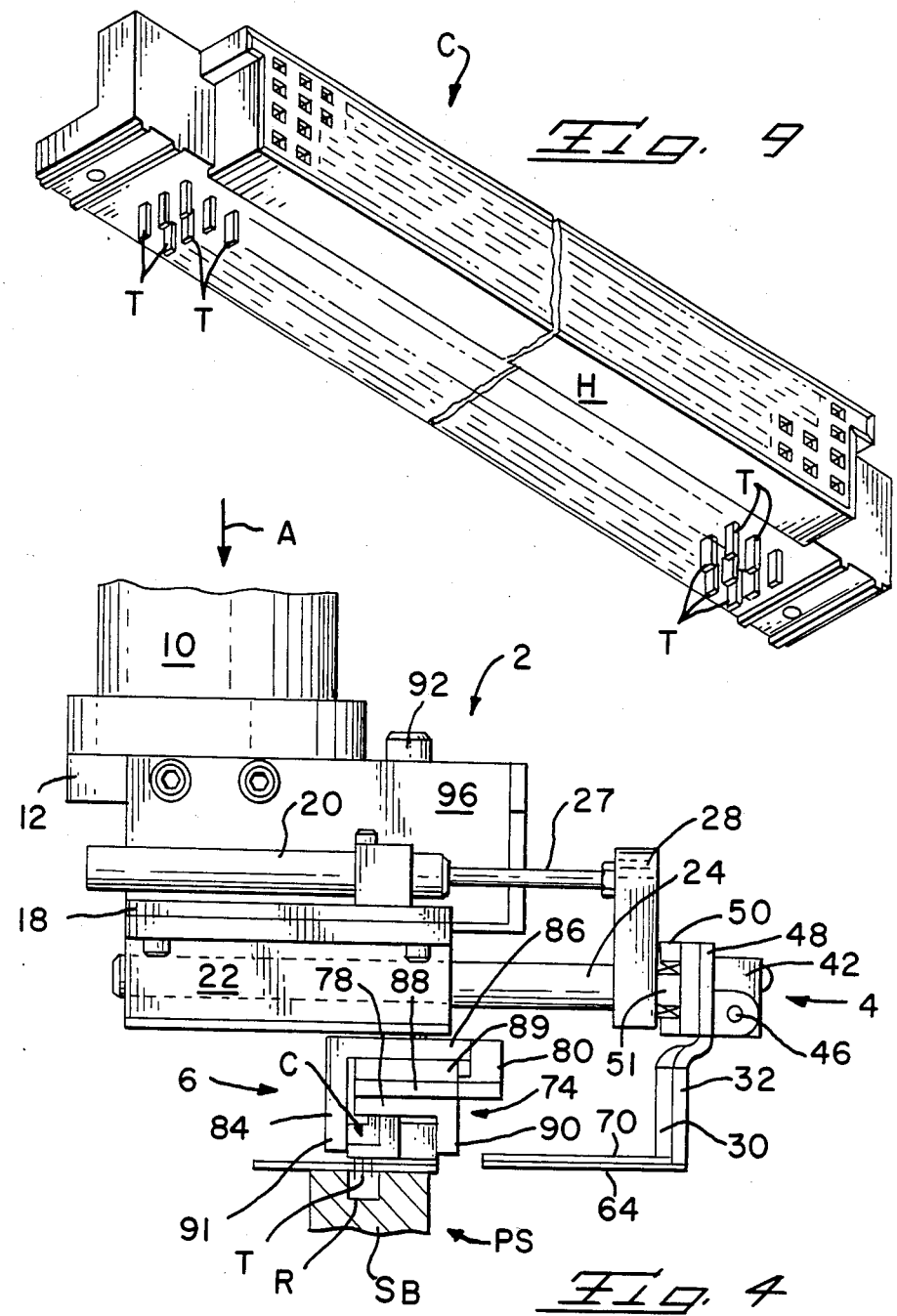

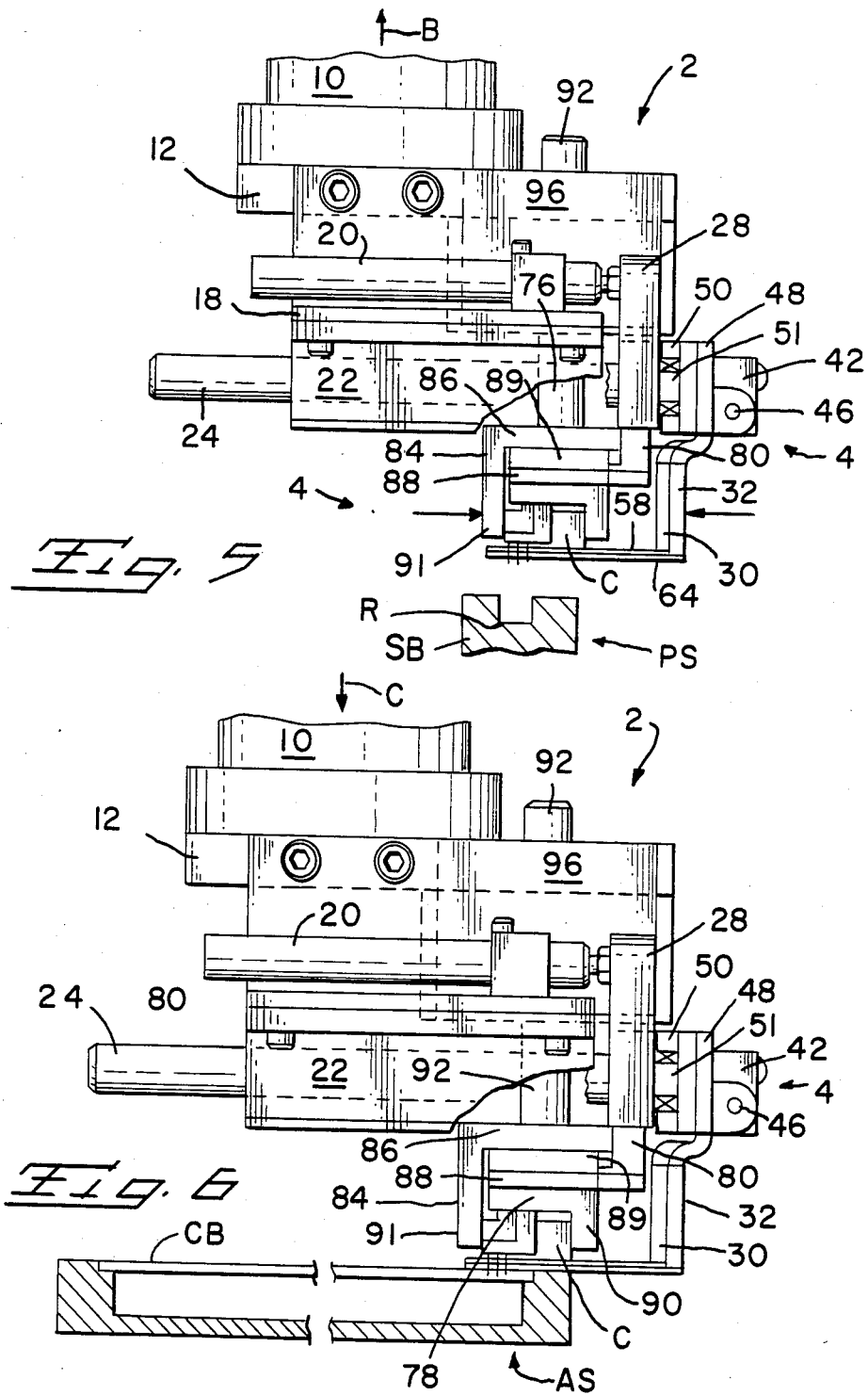

ASSEMBLING ELECTRICAL CONNECTORS TO A CIRCUIT BOARD

This invention relates to a pick-up head for, and to a method of, picking up elongate electrical connectors having contact tails depending therefrom and placing the connectors on circuit boards to insert said tails through holes therein.

Long electrical connectors, for example electrical connectors of 9 inches (22.86 cm) in length are susceptible to warpage, that is to say to bowing, in more than one orthogonal direction, under the influence of temperature or humidity changes and the contact tails are commonly deformed laterally as a result of handling or transportation of the connectors. Such warpage and/or deformation inhibits alignment of the contact tails with the holes in the circuit boards, for insertion into the holes.

Although there are described in U.S. Pat. No. 4,611,846 pick-up heads for use with a pick-and-place robot assembly, for picking up electrical connectors and placing them on circuit boards, these pick-up heads are not specifically designed for use with long connectors of the kind mentioned above.

A pick-up head according to the invention comprises a pair of clamping bars mounted to a frame for attachment to the Z-axis shaft of a pick-and-place robot, and contact tail combing means also mounted to the frame. One of the clamping bars is arranged to press the connector down against a connector support at a connector pick-up station and the other bar is arranged to cooperate with the other bar to straighten the connector laterally. The bars thus correct both vertical and horizontal warping of the connector. With the connector gripped between the bars, the robot raises its Z-axis shaft, thereby lifting the connector from the support and the combing means are engaged with the contact tails to straighten them, with the tips of the contact tails projecting below the combing means. The robot then transfers the pick-up head to a position above a circuit board at a circuit board assembly station and said bars are lowered to insert the tip of each contact tail into a corresponding hole in the circuit board. The combing means are then withdrawn from the contact tails and the robot lowers the insertion head further to insert the contact tails into the holes, after which the bars are relatively moved away from each other to release the connector and the robot transfers the pick-up head back to the pick-up station to pick-up a further connector therefrom, and so on.

For a better understanding of the invention, reference will now be made by way of example to the accompanying drawings in which:

FIG. 1 is an isometric view of a robot pick-up head for long electrical connectors;

FIG. 2 is a front view of the pick-up head with parts omitted;

FIG. 3 is a plan view of the pick-up head with parts omitted;

FIGS. 4 to 7 are end views of the pick-up head illustrating successive stages in the operation thereof;

FIG. 9 is an isometric view of an electric connector of the kind with which the pick-up head is intended for use.

Figure 7:
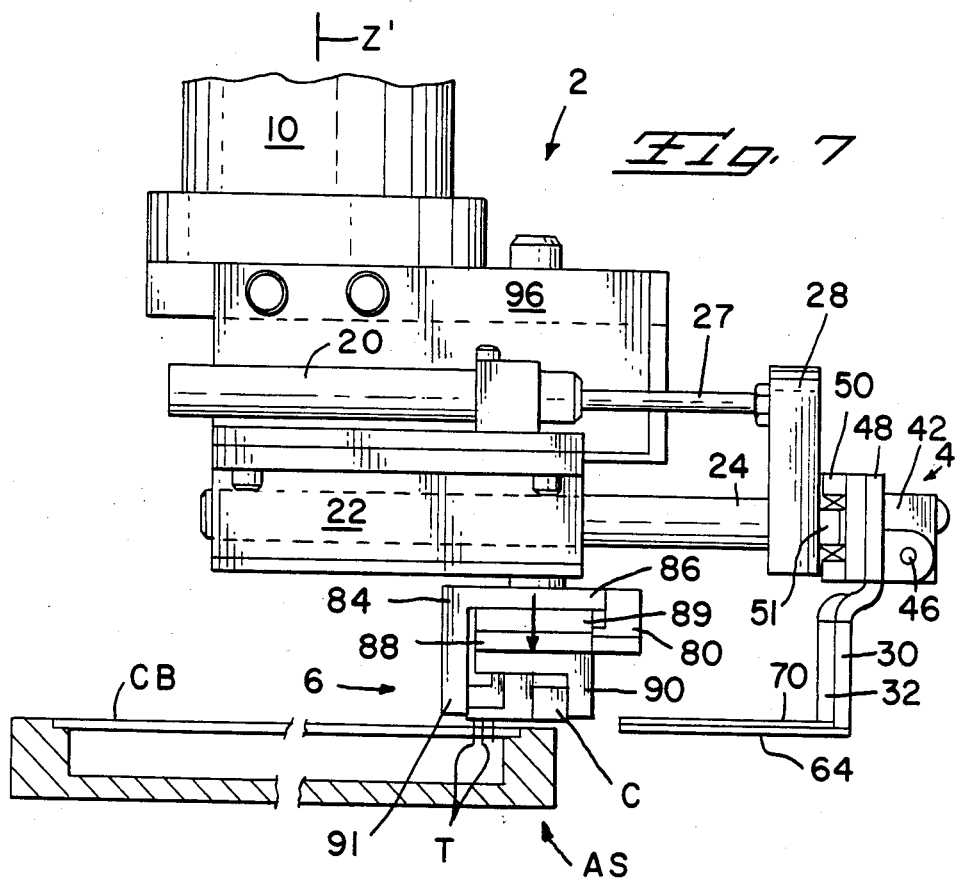

The robot pick-up head comprises a main framework 2, a contact comb straightening assembly 4 and a connector clamping and straightening assembly 6.

The assembly 2 comprises a top plate 8 from which upstands a vertical mounting shaft 10 adapted to be secured to the Z-axis shaft of the operating arm (not shown) of a robot for carrying out electrical connector pick and place operations, with a vertical axis Z' of the pick-up head coincident with the axis of said Z-axis. The plate 8 comprises a cross-bar 12 and a supporting lobe 14, projecting centrally from the part 12 and having secured to its underside a soft insertion piston and cylinder unit 16. There depends from each end of the part 12, an L cross section side plate 18 carrying a piston and cylinder unit 20 for moving the comb assembly 4 towards and away from the framework 2. Each plate 18 has secured therebeneath a bearing block 22 receiving, for horizontal sliding movement, a guide shaft 24 secured to a comb support bar 26 of the comb assembly 4. The piston rod 27 of each unit 20 is fixed to a lobe 28 projecting from the bar 26 above the proximate guide rod 24.

Figure 8A:
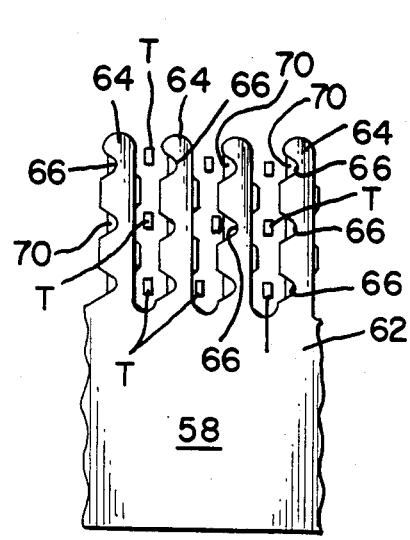
FIGS. 8A and 8B are fragmentary underplan views illustrating the operation of contact tail straightening combs of the pick-up head.
Figure 8B:
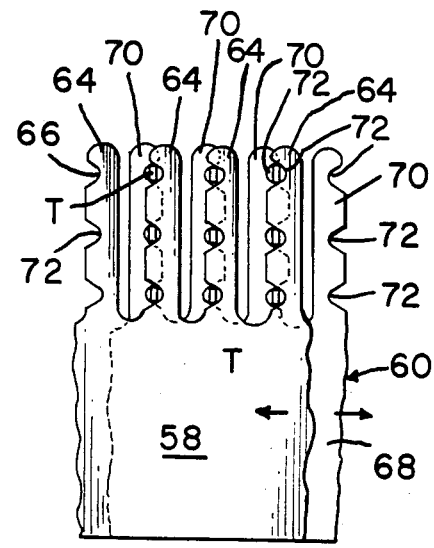

The comb assembly 4 comprises a pair of relatively horizontally slidable comb support plates 30 and 32, guide studs 34 on the comb plate 30 engaging in horizontal slots 36 in the comb plate 32 relatively to guide the plates 30 and 32 for horizontal sliding movement in contiguous relationship with one another. There are secured to the bar 26, by way of support blocks 38 and 40 respectively, an inner comb drive piston and cylinder unit 42 and an outer comb drive and cylinder unit 44. The unit 42 has a piston rod 46 secured to a slide plate 48 which is in turn secured to the plate 30 and which is horizontally slidable with respect to a support block 50 on the bar 26 on bearings 51. The unit 44 has a piston rod 52 connected to a slide plate 54 secured to the comb 32 and which is horizontally slidable with respect to a block 56 secured to the bar 28, by way of further bearings 57. The plates 30 and 32 have, extending from their lower edges, contact tail straightening combs 58 and 60, respectively. As shown in FIGS. 8A and 8B, the comb 58 comprises a plate 62 from which an edge of which project juxtaposed, spaced, parallel teeth 64, each tooth 64 being formed with a row of recesses 66 spaced equally along the length of the tooth and opening leftwardly as seen in FIGS. 8A and 8B. The comb 60 comprises a plate 68, from an edge of which project teeth 70 in juxtaposed parallel relationship and being spaced from one another by the same distance as the teeth 64. Each tooth 70 is formed with a row of recesses 72 which are spaced from one another by the same distance as the recesses 66 of the teeth 64 and which are aligned therewith. Similar combs and their mode operation are described in U.S. Pat. No. 4,488,581 which is incorporated herein by reference.

The assembly 6 comprises a connector clamping and straightening bar 74 which is of L-shaped cross section and which is connected to the piston rod 76 of the piston and cylinder unit 16. The bar 74 has an upper horizontal arm 78 from which depend horizontally spaced vertical lower arms 90 (See FIGS. 1 and 2). On the upper arm 78 of the bar 74 to which arm the piston rod 76 is fixed, are piston and cylinder units 80 having piston rods 82 secured to a clamping bar 84 to which are mounted slides 86, one on each side of the units 80. Each slide 86 is connected to a slide support block 88 on the arm 74 of the bar 78, by way of bearings 89, whereby the bar 84 is horizontally slidable with respect to the bar 74, at right angles to the longitudinal axis thereof by actuating the units 80. The arm 78 and the bar 84 extend orthogonally with respect to the arms 90. The bar 84 depends below the bar 74 as best seen in FIGS. 4 to 7 to the extent that a marginal portion 91 of the bar 84 lies at the level of the arms 90 of the bar 74. The bar 74 is mounted on vertical slide rods 92 secured to the arm 78 of the bar 74 and which are received in slide way blocks 94 secured to vertical parts 96 of the side plates 18.

For operation of the pick-up head, the shaft 10 is mounted to the Z axis shaft of a pick and place robot, for example of the kind described in U.S. Pat. No. 4,611,846 which is incorporated herein by reference. Such a robot is arranged to pick up electrical connectors supplied to electrical connector pick-up stations, to carry the connectors one by one to a circuit board assembly station and to insert contact tails depending from each connector into corresponding holes in a printed circuit board at the assembly station.

The pick-up head described above, when mounted to the said Z-axis shaft, is for picking up long electrical connectors C, one of which is shown by way of example in FIG. 9. The connector C has a housing H from which depend therebeneath rows of three contact tails T. However, the said rows could, for example, be four in number. By means of the pick-up head, the connectors C are transferred from a pick up station PS, shown diagrammatically in FIGS. 4 and 5, to an assembly station AS, which is shown diagrammatically in FIGS. 6 and 7.

The electrical connectors C are supplied to the station PS with their contact tails T projecting into a recess R of connector support block SB on which the connector C rests.

The units 16, 20, 42, 44 and 80 are operated under the control of the microprocessor of the robot according to a predetermined circuit board assembly program.

In order to pick up a connector C from the station PS, the piston rods 27, 46, 52, and 82 are first moved to their advanced positions under the control of the microprocessor, the piston rod 76 being moved to a retracted position, and the pick-up head is lowered towards the station PS in the direction of the arrow "A" in FIG. 4 so that the arm 78 of the bar 74 engages the top of the connector C as shown in FIG. 4, thereby straightening the connector C in cooperation with the block SB to correct any vertical warping of the connector.

As shown in FIG. 4, the comb teeth 64 and 70 are horizontally spaced from the assembly 6, the bar 84 is in a position remote, in a horizontal direction, from the bar 78 and the teeth 64 and 70 of the combs 58 and 60 are in register with one another as shown in FIG. 8A to allow them to be passed between the rows of contact tails T. With the pick-up head positioned as shown in FIG. 4, the units 80 are actuated to retract their piston rods 82 so that the connector C is squeezed horizontally, between the portion 89 of the bar 84 and the arms 90 of the bar 74 thereby correcting any horizontal warping of the connector C, the connector being maintained in a strictly linear configuration between the arms 74 and 84.

The robot now raises the pick-up head vertically in the direction of the arrow B in FIG. 5 so that the connector C, by virtue of its frictional engagement with the bars 74 and 84, is raised from the block SB, and the piston rods 27 are retracted so that the comb teeth 74 and 70 receive the contact tails of the connector C between them, as shown in FIG. 8A, and the units 42 and 44 are actuated to retract their piston rods 46 and 52 so that the comb teeth 64 and 70 are closed about the contact tails which are thereby received in the recesses 66 and 72 of the teeth 64 and 70 as shown in FIG. 8B. This closure of the teeth against the tails T straightens any of the nails T which may be bent so that they do not extend precisely normally of the connector housing H.

The robot now carries the pick-up head to a position above a circuit board CB supported at the assembly station AS, as shown in FIG. 6, and then lowers the pick-up head vertically towards the board CB in the direction of the arrow C in FIG. 6, to a position in which the connector C is spaced slightly above the board CB. The unit 16 is now actuated to advance its piston rod 76 to drive down the bars 74 and 84 thereby to insert the tips of the contact tails T, which project below the combs 58 and 60, into respective holes in the board CB. The units 42 and 44 are then actuated to advance their piston rods 46 and 52, so that the comb teeth 64 and 70 are returned to their FIG. 8A positions, and the units 20 are actuated to advance their piston rods 27 so that the comb teeth 64 and 70 are withdrawn so as to be clear of the connector C, as shown in FIG. 7. The robot then lowers the pick-up head fully to insert the contact tails T of the connector C into their holes in the board CB, and the units 80 are actuated to advance their piston rods 82 so that the bar 84 is moved away from the bar 74 thereby to release the connector C from the pick-up head. The robot now raises the pick-up head and transports it back to the pick up station PS to pick up another connector therefrom in the manner described above.

Since the contact tails T are firmly fixed in the holes in the boards CB, for example by means of enlarged portions of the tails T which frictionally engage the walls of the holes, the connector C cannot revert to its warped condition.

Means may be provided for sensing the insertion pressure exerted by the soft insertion piston and cylinder unit 16 and to signal to the robot microprocessor that a fault has occurred, should said pressure exceed a predetermined value.

What is claimed is:

1. A pick-up head for use in picking up elongate electrical connectors having contact tails depending therefrom and placing the connectors on circuit boards to insert said tails into holes therein, the pick-up head comprising;

a framework having a vertical axis and means for attaching said framework to the Z-axis shaft of a pick-and-place robot with said vertical axis coincident with the axis of said Z-axis shaft;

a pair of connector clamping bars connected to said framework for vertical movement relative thereto and for horizontal movement relatively towards each other to clamp between orthogonally extending surfaces of said bars, an elongate electrical connector extending normally of said vertical axis, the bars being moveable relatively away from each other to release the connector;

a pair of combs mounted to said framework for movement towards and away from said clamping bars and being relative movable between a first position to receive between them the contact tails of a connector clamped between said clamping bars and a second position to grip and thereby to straighten said contact tails;

first drive means connected to the framework and said bars for moving said bars towards and away therefrom;

second drive means connected to said bars for moving them towards and away from each other;

third drive means connected to said framework for moving said combs towards and away from said framework; and fourth drive means connected to said combs for moving them between their first and their second positions.

2. A pick-up head as claimed in claim 1, wherein said bars are rectilinear, one of said bars, which is of L-shaped cross section, having a horizontal arm for engaging the connector from above and a vertical arm for engaging one side of the connector, the other bar being disposed opposite to said vertical arm for engaging the opposite side of said connector.

3. A pick-up head as claimed in claim 2, wherein said first drive means comprises a piston and cylinder unit acting between said framework and said horizontal arm.

4. A pick-up head as claimed in claim 1, wherein the combs are carried by a support bar interposed between the framework and the combs, said third drive means comprising a first piston and cylinder unit arranged to act between said framework and said combs and said fourth drive means comprising a second piston and cylinder unit arranged to act between said combs.

5. A pick-up head as claimed in claim 4, wherein each comb comprises a vertical plate carrying teeth of said comb, said plates being connected together in horizontal sliding relationship, the piston of said second piston and cylinder unit being mounted on one of said plates and the cylinder thereof being mounted on the other plate.

6. A pick-up head for use in picking up elongate electrical connectors having contact tails depending therefrom and for placing the connectors on circuit boards to insert said tails through holes therein, the pick-up head comprising;

a framework having a vertical axis and means thereon for attaching said framework to the Z-axis shaft of a pick and place robot with said vertical axis coincident with the axis of said A-axis shaft;

means corrected to the framework for clamping, and straightening in orthogonal directions, an elongate electrical connector, such means having a first connector clamping condition gripping and a second connector release condition;

means on said framework for moving said clamping and straightening means vertically with respect to said framework;

means on said framework for placing said clamping and straightening means in its first and second positions;

contact tail straightening means connected to said framework for horizontal movement between a contact tail engaging first position proximate to said framework to engage and straighten the contact tails of a connector gripped by said gripping and straightening means and a connector tail release position remote from said framework; and means for moving said contact tail straightening means between its first and its second positions.

7. A method of picking up an elongate electrical connector having contact tails depending therefrom and placing the connector on a circuit board, to insert said tails into holes therein, the method comprising the steps of:

feeding the connector onto an electrical connector support at an electrical connector pick-up station;

moving a first connector clamping bar down onto the connector to correct any vertical warping thereof, in cooperation with the connector support;

applying a second connector clamping bar to the connector laterally thereof, to correct any horizontal warping of the connector, in cooperation with the first bar, and to cause the connector to be gripped between the said bars to restrain reversion thereof to a warped condition;

raising said bars to raise the connector from the connector support so that said contact tails are clear thereof;

applying combing means to the contact tails to correct any lateral displacement thereof, with tips of the contact tails projecting below the combing means;

transporting said bars to a position above a circuit board at a circuit board assembly station;

moving said bars down towards said circuit board to insert projecting tips into corresponding holes in the circuit board;

withdrawing said combing means from said contact tails;

again moving said bars down towards said circuit board, further to insert said contact tails into said holes in the circuit board; and moving said bars relatively away from each other to release the connector therefrom.

* * * * *